United States Patent [19]

Banks et al.

[11] Patent Number: 4,620,898

[45] Date of Patent: Nov. 4, 1986

[54] ION BEAM SPUTTER ETCHING

[75] Inventors: Bruce A. Banks, Olmsted Township, Cuyahoga County; Sharon K. Rutledge, Bedford, both of Ohio

[73] Assignee: The United States of America as represented by the Administrator of the National Aeronautics and Space Administration, Washington, D.C.

[21] Appl. No.: 775,968

[22] Filed: Sep. 13, 1985

[51] Int. Cl.[4] .................... B44C 1/22; C03C 15/00; C03C 25/06

[52] U.S. Cl. .................... 156/643; 156/646; 156/659.1; 156/661.1; 156/904; 156/345; 204/298; 204/192.3; 204/192.32

[58] Field of Search ........ 204/192 C, 192 EC, 192 E, 204/298; 156/643, 646, 659.1, 661.1, 904, 345; 427/38, 39; 118/728, 50.1, 620

[56] References Cited

U.S. PATENT DOCUMENTS

| | | | |
|---|---|---|---|
| 2,841,477 | 7/1958 | Hall | 41/42 |
| 2,989,385 | 6/1961 | Gianola et al. | 41/42 |
| 3,113,896 | 12/1963 | Mann | 156/3 |
| 3,271,286 | 9/1966 | Lepselter | 204/192 |
| 3,908,041 | 9/1975 | Engl et al. | 427/101 |
| 3,966,577 | 6/1976 | Hochberg | 204/192 |
| 4,053,350 | 10/1977 | Olsen et al. | 156/659.1 |
| 4,293,374 | 10/1981 | Chaudhari et al. | 156/628 |
| 4,414,069 | 11/1983 | Cuomo | 204/192 E |
| 4,486,286 | 12/1984 | Lewin et al. | 204/192 C |

OTHER PUBLICATIONS

"Ion Beam Sputter-Deposited Diamondlike Films", B. A. Banks et al., J. Vac. Sci. Technol., 21(3), Sep./Oct. 1982, pp. 809–814.

FIG. 1 from "Thin Film Processes"—Vossen & Kern, Academic Press, 1978—(original from Proc. IEEE, vol. 62, p. 1361).

"Reactive Sputter Etching and its Application" by Wang et al. from Solid State Technology, Aug. 1980; pp. 122–126.

Primary Examiner—William A. Powell
Attorney, Agent, or Firm—Gene E. Shook; John R. Manning

[57] ABSTRACT

An ion beam etching process which forms extremely high aspect ratio surface microstructures using thin sputter masks is utilized in the fabrication of integrated circuits. A carbon rich sputter mask together with unmasked portions of a substrate is bombarded with inert gas ions while simultaneous carbon deposition is occurring. The arrival of the carbon deposit is adjusted to enable the sputter mask to have a near zero or even slightly positive increase in thickness with time while the unmasked portions have a high net sputter etch rate.

21 Claims, 13 Drawing Figures

ION BEAM SPUTTER ETCHING

ORIGIN OF THE INVENTION

The invention described herein was made by employees of the U.S. Government and may be manufactured and used by or for the Government for governmental purposes without the payment of any royalties thereon or therefor.

TECHNICAL FIELD

This invention relates to an improved ion beam etching process. The invention is particularly concerned with forming extremely high aspect ratio surface microstructures with thin sputter masks.

Conventional ion beam sputter techniques may use masks of organic resist material, metal, or metal oxides. These masks limit the aspect ratio of the surface structures because the mask material has a finite sputter etch rate. As the mask material etches away, the walls of the etched substrate become sloped or faceted rather than having an ideal vertical configuration.

Organic masks are typically heat sensitive and cannot be used at high ion beam power density levels. Thus, organic sputter masks do not permit high sputter etch rates to be used.

Metal and metal oxide masks must be removed by wet chemical means as opposed to vacuum plasma processing. Therefore, these masks require an additional type of processing which may contribute to possible fabrication caused defects.

It is, therefore, an object of the present invention to provide surface microstructures of sputter etched pits, wells, or channels with extremely high height to width ratios.

BACKGROUND ART

Facet formation in a photoresist material caused by ion bombardment is illustrated in FIG. 1 of an article entitled "Thin Film Processes" which was edited by J. L. Vossen and W. Kearn, *Academic Press,* 1978. The original discussion is from an article by H. I. Smith, Procedures I.E.E.E. Vol. 62, page 1361, 1974.

Mann U.S. Pat. No. 3,113,896 illustrates a method of masking utilizing a photoresist process. This type of masking is used for etching patterns for electric circuits using electron beam etching. A polymerized film pattern is formed by bombarding the base metal with a relatively wide angle electron beam in the presence of a polymerizable vapor with the beam passing through a multi-apertured mask to confine the film deposited to predetermined areas of the base metal.

DISCLOSURE OF THE INVENTION

According to the present invention ion beam sputter etching is used in conjunction with a carbon sputter mask or an organic mask that can be decomposed to produce a carbon rich sputter mask surface that is extremely thin. This decomposition can be effected by thermal decomposition and/or ion bombardment scission of the surface polymers.

The mask, together with the unmasked portion of the substrate, is bombarded with inert gas ions while simultaneous carbon deposition is occurring. The arrival of sputter or vapor deposited carbon is adjusted to enable the sputter mask to have a near zero or even slightly positive increase in thickness with time. At the same time the unmasked portion of the substrate has a high net sputter etch rate. The process is particularly useful in the fabrication of integrated circuits.

BRIEF DESCRIPTION OF THE DRAWINGS

Details of the invention will be described in connection with the accompanying drawings wherein.

BEST MODE FOR CARRYING OUT THE INVENTION

Figure 1:
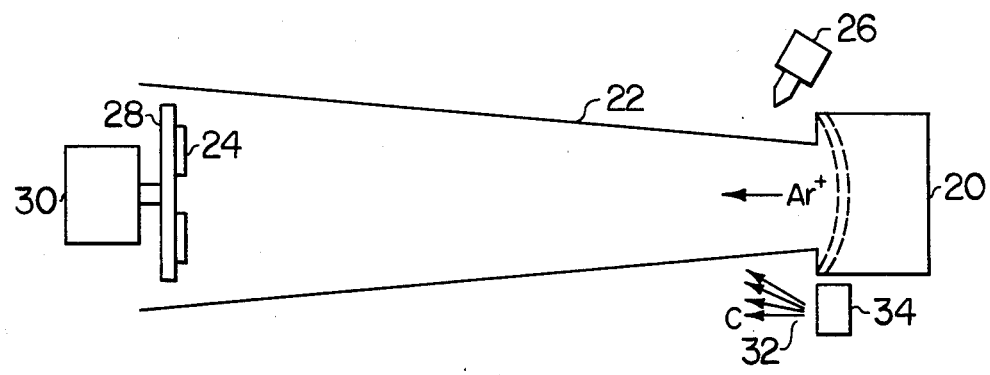
FIG. 1 is schematic view of apparatus for performing the ion beam etching process of the present invention.
Figure 2:
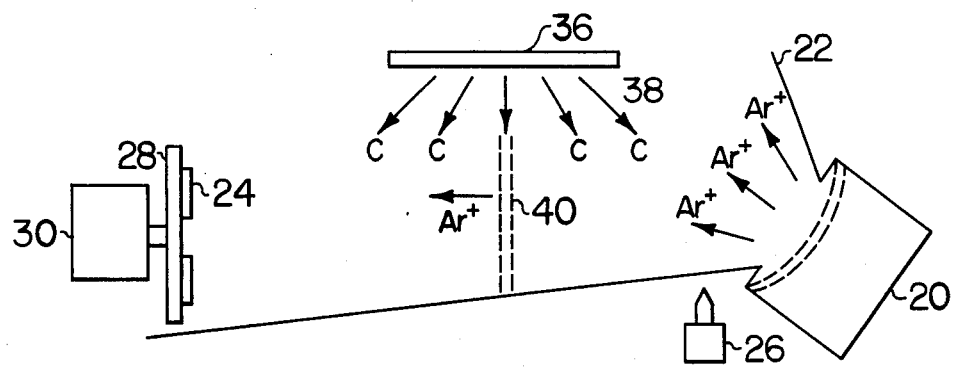
FIG. 2 is a schematic view illustrating an alternate embodiment of the apparatus shown in FIG. 1.
Figure 3:
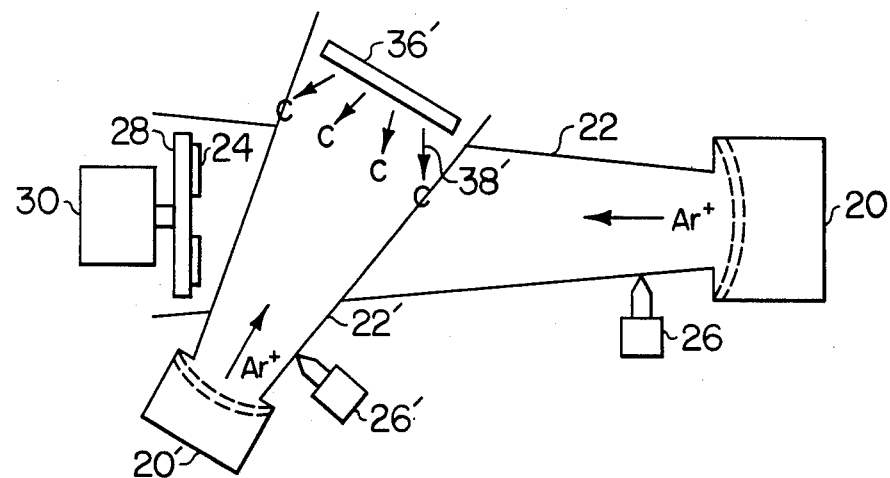
FIG. 3 is a schematic view illustrating still another embodiment of the apparatus shown in FIG. 1.
Figure 4:
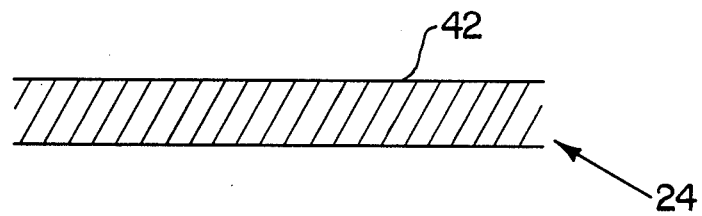
FIGS. 4 to 9 are schematic views illustrating the sequence of steps of the ion beam etching process of the invention.

Referring now to the drawings, FIGS. 1, 2 and 3 illustrate various ion source configurations that provide sputter etching simultaneously with carbon deposition. Each of these embodiments utilized a suitable source 20 to provide an ion beam 22. The ion beam 22 is between 300 eV and 2000 eV with a diameter and current density sufficient to etch substrates 24 mounted in the path of the beam.

An argon ion beam 22 may be from an electron bombardment ion source 20 of the type developed for electric propulsion technology. Such an ion source is described in "Advances in Electronics and Electron Physics" by H. R. Kaufman, vol. 36, pages 365–373.

Beam extraction may be accomplished by a dished, 2-grid ion optics system. Such a system is described in AIAA Paper No. 76-1017 entitled "A 30 cm Diameter Argon Ion Source". Neutralization of the ion beam may be achieved by a hot wire or hollow cathode neutralizer 26.

A vacuum facility (not shown) houses the ion source 20. This vacuum facility is sufficiently large to minimize back sputter facility material from contaminating the material of the substrate 24 that is being ion beam etched. The vacuum facility normally is maintained at a pressure of $4 \times 10^{-5}$ torr during the operation of the ion source 20.

The substrates 24 are mounted on a suitable fixture 28 that is normal to the beam 22. The fixture 28 is, in turn, mounted for rotation on a drive motor 30. During the ion beam sputter etching the motor 30 rotates the fixture in a circular motion normal to the beam 22 to ensure uniform impingement of the ions on the substrates 24.

Referring now to FIG. 1 a beam 32 of carbon atoms is directed toward the substrates 24 in the ion beam 22. The carbon beam 32 is supplied by an electron beam evaporator 34.

Referring to FIG. 2 a suitable target 36 of carbon is mounted in the argon beam 22. Carbon atoms 38 are ion beam sputtered from the surface of the target 36 and carried to the substrates 24.

A carbon neutral filter 40 shown in FIG. 2 is mounted in the ion beam 22 between the ion source 20 and substrates 24. This filter reduces the current density of the argon ion beam by blockage of a portion of the ion beam.

In the configuration shown in FIG. 3 a carbon target 36' is positioned outside the ion beam 22. This target 36' is mounted normal to a second ion beam 22' supplied by a suitable argon source 20' that is similar to the source 20. Carbon atoms 38' are sputter-etched from the surface of the target 36' and allowed to deposit on the substrate 24 in the same manner as shown in FIG. 2.

FIGS. 4–9 show the sequence of steps in the ion beam etching process of the present invention. A clean substrate 24 has an exposed surface 42 which is to be etched. The surface 42 faces the ion beam 22 in FIGS. 1–3. The substrate may be a part of any of a number of different devices which require etched surfaces. Such devices are customarily used in the microelectronics arts.

Figure 5:
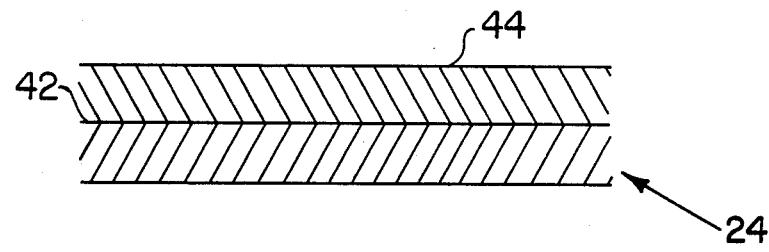

In FIG. 5 the surface 42 of the substrate 24 has been coated with a resist layer 44 of negative or positive photoresist or electron resist material. This resist layer 44 may be applied by using any of a number of conventional processes.

Figure 6:
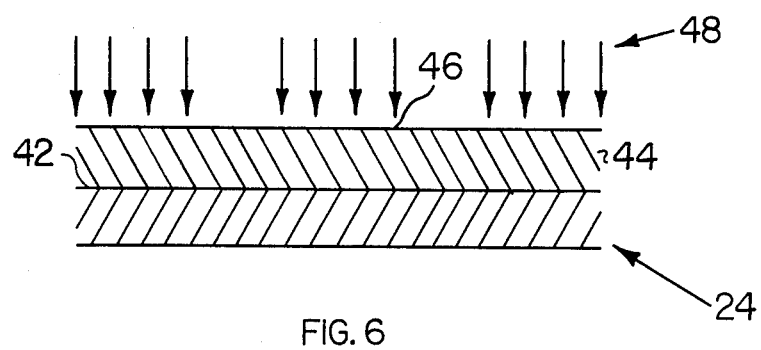

As shown in FIG. 6 selected areas 46 of the resist layer 44 are exposed to an incident flux 48 of electrons or photons. The photons may be in the visible, ultraviolet, or X-ray regions.

Figure 7:
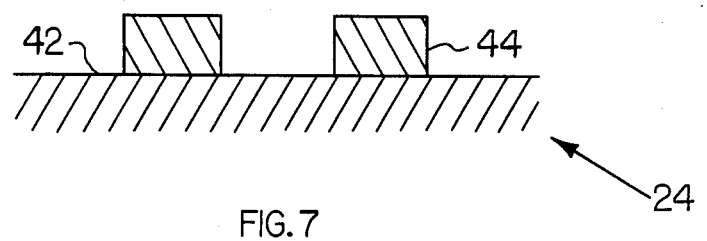

FIG. 7 shows the exposed resist coated substrate after development. Those selected areas which were exposed to the electrons or photons are removed by chemical means, such as solvents. Depending on whether a negative or a positive resist material was used, the unexposed or exposed portions of the resist will be removed. More particularly, if a positive resist material is used those portions exposed to electrons or photons will be removed.

Figure 8:
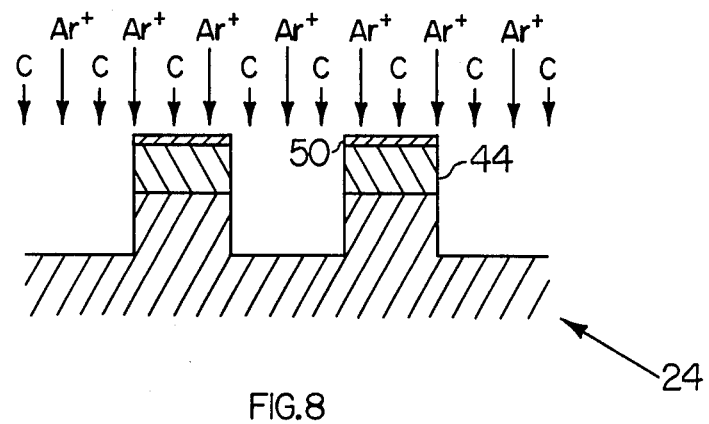

The substrate 24 is then mounted on the fixture 28 as shown in FIGS. 1–3. The simultaneous high energy, 300 eV to 2000 eV, argon ion bombardment and low energy, less than 2 eV, carbon atom deposition on the entire surface of the substrate 24 and the remainder of the resist layer 44 is shown in FIG. 8.

The exposed surface of the resist material 44 is covered with a coating 50 which is predominantly carbon. This coating 50 is the result of the energetic ion bombardment of the resist material 44 combined with the heating of the substrate 24. Thus, through polymeric chain scission by way of sputtering or thermal decomposition of the resist material, the top outermost surface of the remainder of the layer 44 loses most of its hydrogen becoming mostly carbon atoms of low sputter yield. Because this carbon coating 50 is of such low sputter yield compared to the material of the substrate 24, the simultaneous carbon deposition and ion beam sputtering can be proportioned such that the carbon layer does not sputter away while there is substantial removal of the substrate material. Therefore, the carbon coating 50 forms a long life sputter mask.

Figure 9:
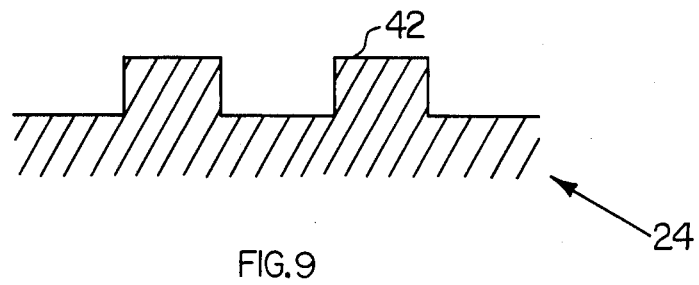

After the required amount of substrate sputter etching is accomplished, the carbon coating 50 can be chemically or oxygen-plasma etched away to yield the final etched substrate configuration suitable for further microelectronic processing. This is shown in FIG. 9.

ALTERNATE EMBODIMENT OF THE INVENTION

Figure 10:
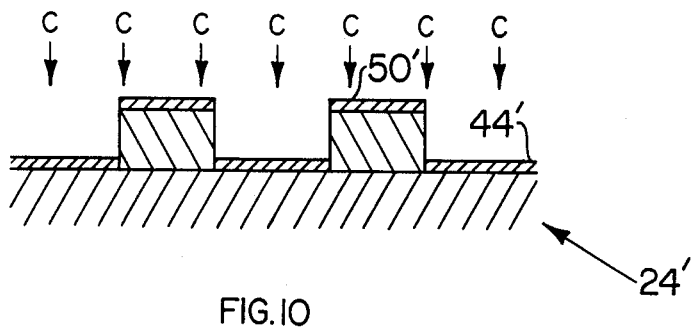
FIGS. 10 to 13 are schematic views illustrating the sequence of steps of an alternate embodiment of the invention as shown in FIGS. 4 to 9.
Figure 11:
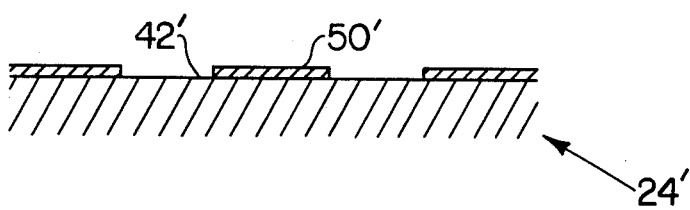

FIGS. 10–13 show an alternate technique for executing the process of the invention. More particularly, as shown in FIG. 10, a carbon coating 50' is deposited by way of vapor or sputter deposition over a developed resist layer 44' on a surface 42' of a substrate 24'. This insures a dense carbon surface needed for long mask life. The resist material of the layer 44' is then removed by way of chemical removal, thus stripping away and exposing portions of the surface 42' on the substrate 24' as shown in FIG. 11.

Figure 12:
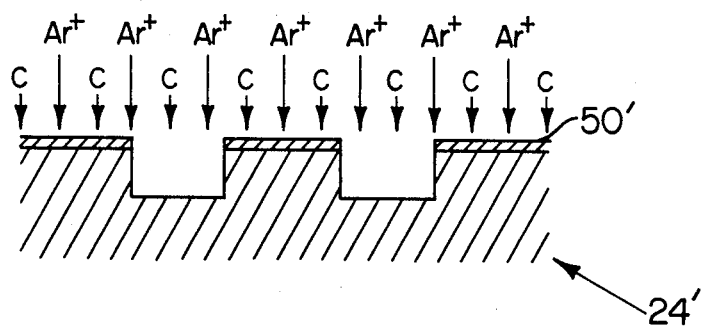
Figure 13:
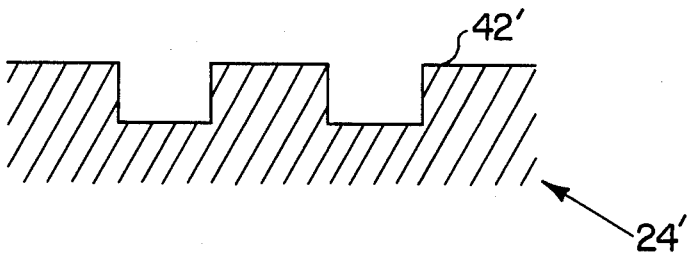

FIG. 12 shows a simultaneous carbon deposition with argon ion sputtering similar to that depicted in FIG. 8. FIG. 13 shows the completed substrate 24' after oxygen plasma ashing of the carbon film 50'.

The alternate embodiment shown in FIGS. 10 through 13 depict a process suitable for high temperature ion beam processing and/or extremely high resolution etching of high aspect ratio, deep but narrow channel, surface features. Such an alternate embodiment is suitable for submicron structures.

While several embodiments of the invention have been disclosed and described it will be appreciated that various modifications may be made to the disclosed method and resulting structure without departing from the spirit of the invention and the scope of the subjoined claims.

We claim:

1. A method of ion beam sputter etching a surface of a substrate comprising the steps of
    forming a carbon sputter mask on said surface,
    simultaneously bombarding said masked surface with high energy ions to sputter etch the same while depositing low energy carbon atoms thereon whereby the thickness of the carbon sputter mask remains substantially constant, and
    removing said carbon mask after a predetermined amount of substrate material has been sputtered away.

2. A method of ion beam sputter etching a surface of a substrate as claimed in claim 1 wherein the surface is bombarded with argon ions.

3. A method of ion beam sputter etching a surface of a substrate as claimed in claim 2 wherein the argon ions have a high energy between about 300 eV and about 2000 eV.

4. A method of ion beam sputter etching a surface of a substrate as claimed in claim 1 wherein the low energy carbon atoms have energies less than about 2 eV.

5. A method of ion beam sputter etching a surface of a substrate comprising the steps of
    coating said surface with a layer of resist material,
    exposing selected areas of said resist layer to an incident flux,
    removing predetermined areas of said resist layer,
    simultaneously bombarding said surface and the remaining resist material with high energy ions to sputter etch the same while depositing low energy carbon atoms thereon whereby a carbon coating is produced on the surface of the remaining resist material thereby forming a sputter mask, and
    removing said carbon coating after a predetermined amount of substrate has been sputter etched away.

6. A method of ion beam sputter etching a surface of a substrate as claimed in claim 5 wherein said predetermined areas of said resist layer are removed by chemical solvents.

7. A method of ion beam sputter etching a surface of a substrate as claimed in claim 5 wherein the low energy carbon atoms have energies less than about 2 eV.

8. A method of ion beam sputter etching a surface of a substrate as claimed in claim 5 wherein the carbon coating is removed by chemical solvents.

9. A method of ion beam sputter etching a surface of a substrate as claimed in claim 5 wherein the carbon coating is removed by oxygen-plasma etching.

10. A method of ion beam sputter etching a surface of a substrate as claimed in claim 6 wherein
said layer on said surface is a positive resist material, and
said predetermined areas of said resist layer that are removed are the selected areas exposed to the incident flux.

11. A method of ion beam sputter etching a surface of a substrate as claimed in claim 10 wherein the selected areas of the positive resist material are exposed to a flux of electrons.

12. A method of ion beam sputter etching a surface of a substrate as claimed in claim 10 wherein the selected areas of the positive resist material are exposed to a flux of photons.

13. A method of ion beam sputter etching a surface of a substrate as claimed in claim 6 wherein
said layer on said surface is a negative resist material, and
said predetermined areas of said resist layer that are removed comprise those portions of said layer that are not exposed to the incident flux.

14. A method of ion beam sputter etching a surface of a substrate as claimed in claim 13 wherein the selected areas of the negative resist material are exposed to a flux of electron.

15. A method of ion beam sputter etching a surface of a substrate as claimed in claim 13 wherein the selected areas of the negative resist material are exposed of a flux of photons.

16. A method of ion beam sputter etching a surface of a substrate as claimed in claim 13 wherein the surface and the remaining resist material are bombarded with argon ions.

17. A method of ion beam sputter etching a surface of a substrate as claimed in claim 13 wherein the argon ions have a high energy between about 300 eV and about 2000 eV.

18. A method of ion beam sputter etching a surface of a substrate comprising the steps of
coating said surface with a layer of resist material,
exposing selected areas of said resist layer to an incident flux,
removing predetermined areas of said resist layer to expose portions of said surface,
depositing a carbon coating over the remaining resist material and said exposed portions of said surface,
removing said remaining resist material having the carbon coating thereon thereby uncovering sections of said surface,
simultaneously bombarding said sections of said surface and the remainder of said coating with high energy ions to sputter etch the uncovered section while depositing low energy carbon atoms an said coating to maintaining the same, and
removing said carbon coating after a predetermined amount of substrate has been sputter etched away.

19. A method of ion beam sputter etching a surface of a substrate as claimed in claim 18 wherein the carbon coating is deposited by vapor deposition.

20. A method of ion beam sputter etching a surface of a substrate as claimed in claim 19 wherein the carbon coating is removed by oxygen plasma ashing.

21. Apparatus for ion beam sputter etching unmasked surface portions of a masked substrate to form extremely high aspect ratio surface microstructures comprising
means for bombarding said masked surface with ions to sputter etch said unmasked surface portions, and
means for simultaneously depositing low energy carbon atoms on masked portions of said surface to produce a carbon coating thereon thereby producing a sputter mask.

* * * * *

UNITED STATES PATENT AND TRADEMARK OFFICE
CERTIFICATE OF CORRECTION

PATENT NO. : 4,620,898

DATED : November 4, 1986

INVENTOR(S) : Bruce A. Banks and Sharon K. Rutledge

It is certified that error appears in the above-identified patent and that said Letters Patent is hereby corrected as shown below:

Column 2, line 26, cancel "utilized" and insert --utilizes--

Column 5, line 29, cancel "electron" and insert --electrons--

Column 6, line 18, cancel "an" and insert --on--

Column 6, line 19, cancel "maintaining" and insert --maintain--

Signed and Sealed this

Tenth Day of February, 1987

*Attest:*

DONALD J. QUIGG

*Attesting Officer*   *Commissioner of Patents and Trademarks*